COMPONENT INSERTING EQUIPMENT

Filed June 8, 1962 6 Sheets-Sheet 1

INVENTOR.
Robert R. Diekhoff,
BY Hofgren, Brady,
Wegner, Allen & Stellman
Atty's.

May 26, 1964 R. R. DIEKHOFF 3,134,167

COMPONENT INSERTING EQUIPMENT

Filed June 8, 1962 6 Sheets-Sheet 5

United States Patent Office 3,134,167

Patented May 26, 1964

3,134,167

COMPONENT INSERTING EQUIPMENT

Robert R. Diekhoff, Mount Prospect, Ill., assignor to Warwick Manufacturing Corporation, a corporation of Delaware Filed June 8, 1962, Ser. No. 201,018
7 Claims. (Cl. 29—203)

This invention relates to component inserting equipment and more particularly to a process line for inserting circuit elements on either side of a circuit board including means for inverting the board.

An object of this invention is to provide a process line for inserting circuit elements in a circuit board on either side thereof by inversion of the board intermediate the ends of the line.

Another object of the invention is to provide in a line of component inserting equipment stations means for conveying boards successively through said stations and means intermediate two of said stations for inverting a circuit board to present an opposite side of the board at stations beyond said inverting means.

Still another object of the invention is to provide a circuit board turnover device which is located intermediate a series of component inserting stations including a member in alignment with a conveyor for the boards and rotatable to receive a board from the conveyor with one side up and invert the board to place the opposite side upwardly in alignment with the conveyor extending beyond the device and present said opposite side of the board to succeeding stations.

Further objects and advantages will become apparent from the following detailed description taken in connection with the accompanying drawings in which.

Figure 1:
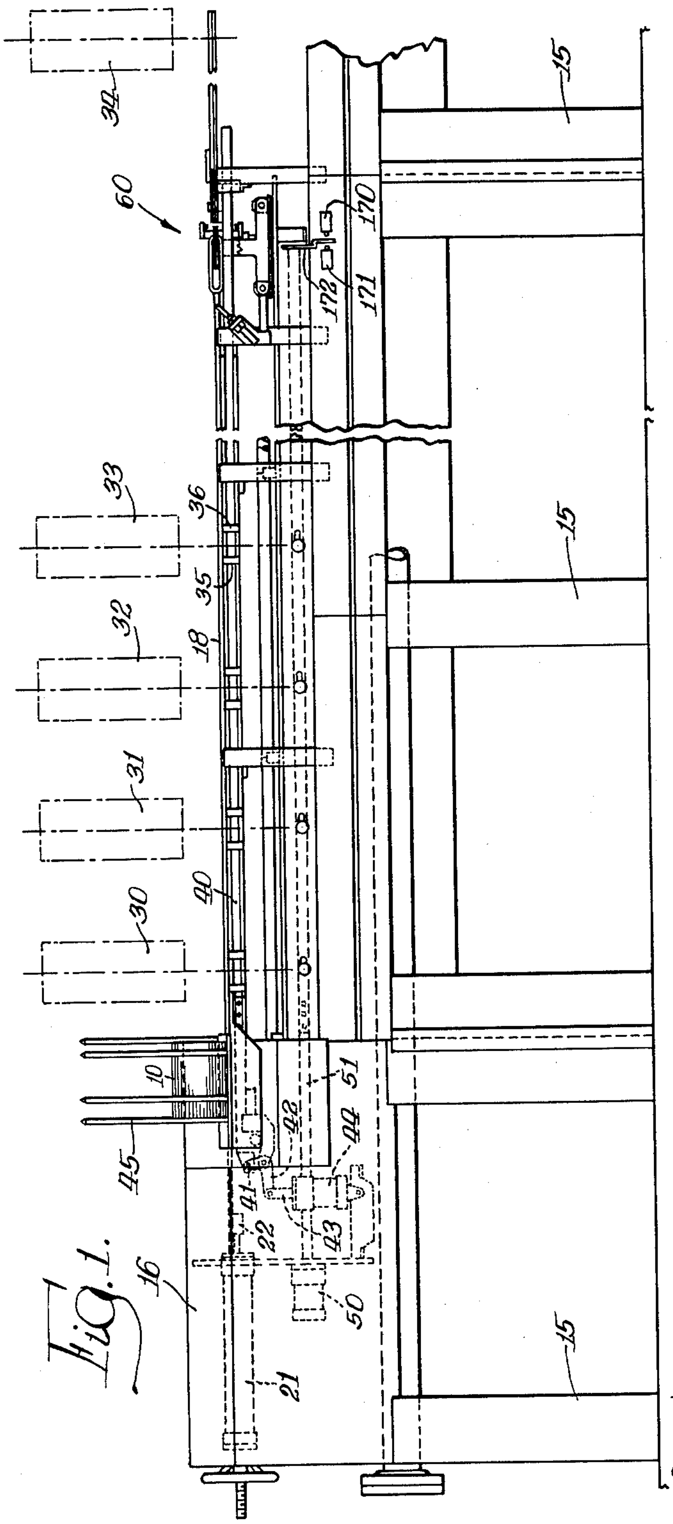
FIG. 1 is a fragmentary central vertical section with parts broken away and with parts at the left-hand end shown in elevation.

While this invention is susceptible of embodiment in many different forms, there is shown in the drawings and will herein be described in detail an embodiment of the invention with the understanding that the present disclosure is to be considered as an exemplification of the principles of the invention and is not intended to limit the invention to the embodiment illustrated. The scope of the invention will be pointed out in the appended claims.

Figure 2:
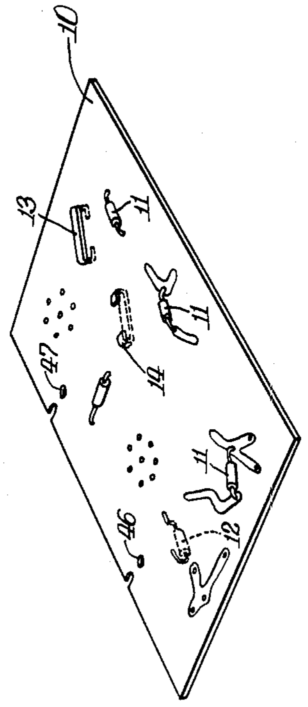
FIG. 2 is a perspective view of the circuit board having circuit elements associated therewith as applied by the inserting line.

The component inserting equipment is shown generally in FIG. 1 and embodies a process line for inserting circuit elements of various types in a circuit board 10 of the type shown in FIG. 2. For illustrative purposes only, board 10 is shown as having circuit elements such as resistors 11 inserted and resting upon one side of the board and additionally may have a resistor such as indicated at 12 engaging the lower opposite side of the board. And similarly jumper wires can be inserted from either side of the board with one being shown at 13 at the upper side of the board and another at 14 which is against the lower side of the board.

Figures 10, 11:
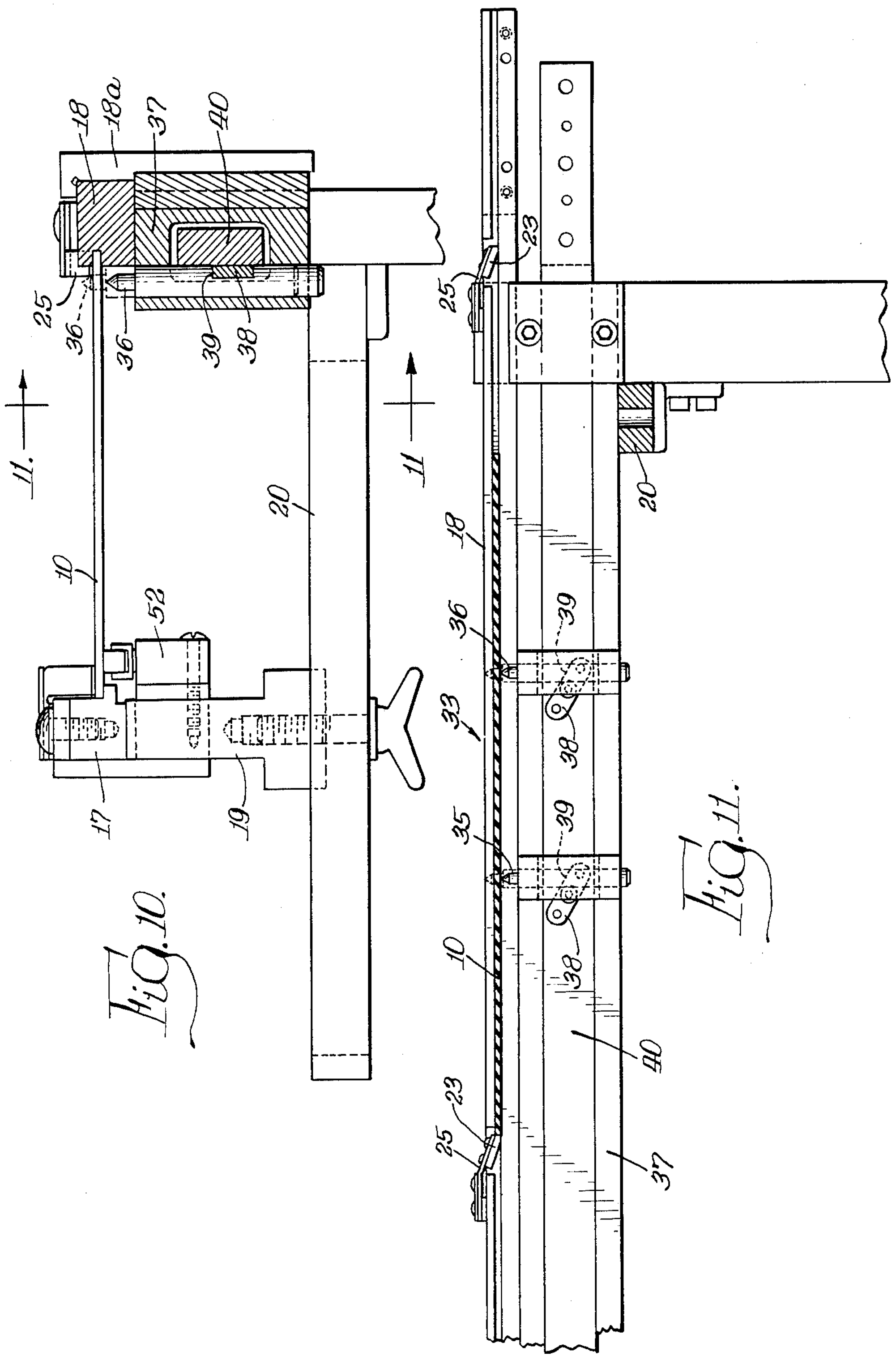
FIG. 10 is a transverse section through one of the component inserting stations showing the board conveying and locating mechanism.
FIG. 11 is a vertical view taken along the line 11—11 in FIG. 10.

As shown in FIG. 1, the machine has a frame with a plurality of supporting legs 15 with a control section 16 at one end having an enclosing housing. As shown in FIGS. 1, 10, and 11, the board 10 is supported for movement through the machine by a pair of rails 17 and 18 with the rail 17 being stationarily mounted by support brackets 19 secured to frame members 20. The rail 18 in addition to supporting the boards also functions as a conveying member for the boards. For this purpose the rail 18 is guided in an elongate frame 18*a* and reciprocated by a motor cylinder 21 which connects to the rail 18 at an end thereof as indicated at 22. The rail has a series of spaced-apart pusher fingers 23 which as they move toward the right as viewed in FIG. 11 engage behind a board 10 and convey the board toward the right. On the leftward movement of the rail 18 the fingers 23 can travel over the board due to the flexible mounting of the fingers by a spring 25.

This return movement of the rail 18 to the left as viewed in FIGS. 1 and 11 with the travel of the fingers over the boards is accomplished without movement of the boards at each of the stations due to the engagement of the board at each station by holding and locating dowels. A series of stations 30, 31, 32, 33 and 34 are indicated generally in FIG. 1 and each of these stations has a component inserting head located above the level of the boards passing through the machine and a coacting anvil member located beneath the boards. These components are known in the art. The anvil member may be of the type disclosed in my copending application Serial No. 199,175, filed May 31, 1962. An example of a head is shown in the copending application of M. R. Parke and G. A. Gagnon, Serial No. 103,480, filed April 17, 1961, now Patent No. 3,102,324, granted September 3, 1963. Each of these stations has a pair of the dowels as indicated at 35 and 36 (FIG. 11) in a retracted full line position and the operative extended position being shown in broken lines. These dowels are each mounted for vertical movement within a casing 37 supported to the frame of the machine and are actuated by an inclined cam bar 38 engaging a similarly shaped slot 39 in the dowel. The bar 38 is carried on a reciprocable rod 40 extending the length of the machine. This rod is connected at an end 41 to a bell crank 42 pivotally mounted on the frame which is connected to a rod 43 of a motor cylinder 44.

Relative to conveying the boards the major components have now been described and the cycle is generally as follows. A board is delivered from the bottom of a magazine 45 and is conveyed by one of the pushers on the movable rail 18 to the first station 30. The motor cylinder 44 then operates to raise the dowels 35 and 36 at that station to engage within suitable apertures 46 and 47 in the board and subsequent to this the cylinder 21 is operated in the opposite direction to move the rail 18 to the left as viewed in FIG. 1 to initial position with the pusher finger on the rail moving upwardly and over the board. As added boards are removed from the magazine 45 the boards travel successively through the stations in the manner described relative to advance of a board to the station 30.

The component inserting head and anvil at each station are air-operated to perform their function as known in the art and the timing of this operation is derived from a motor cylinder 50 which shifts a rod 51 which extends along the length of the line and at each of the stations has a cam member to operate suitable switches connected in circuit for operating air valves (not shown) to supply air to the head and anvil units at a station.

A switch 52 is located at each station to sense the presence of a board 10 and is interlocked with the air-controlling circuit so that a head does not function if a board is not present.

One or more circuit elements can be fastened to the board at each of the stations 30, 31, 32 and 33 on one side thereof and at station 34 and succeeding stations components may be fastened to the board at the opposite side thereof. In order to invert the board between the first and second groups of stations to present an opposite side to the heads at succeeding stations a turnover mechanism is provided. This mechanism is shown in FIGS. 3–9.

Figure 3:
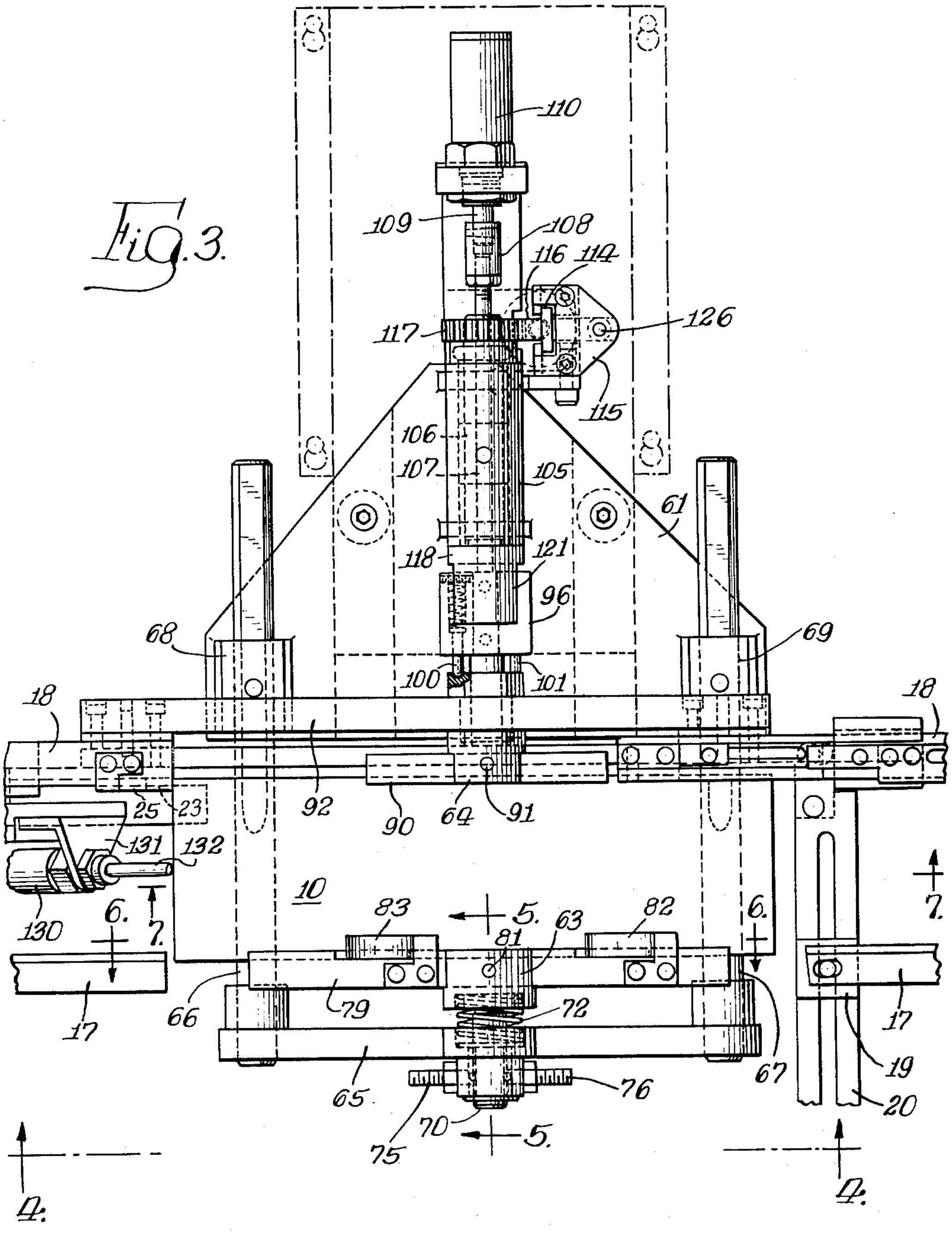
FIG. 3 is a plan view of the circuit board turnover mechanism.

The turnover device is indicated generally at 60 and is shown located in FIG. 1 between the sets of stations. This device includes a base plate 61 secured to the frame of the machine and an upstanding support 62 which carries part of the turnover device. The turnover device includes a pair of board holding members 63 and 64 which line up with the stationary rail 17 and movable rail 18 as shown in FIG. 3.

The holder 63 is supported on a plate 65 which at its lower end has a pair of spaced-apart rods 66 and 67 which extend transversely of the machine to fit in a pair of securing brackets 68 and 69 respectively attached to the base plate 61. By the adjustment provided by shifting the rods 66 and 67 relative to the brackets 68 and 69 the width of the board handled in the turnover device may be adjusted along with similar adjustment in the rail 17. The board holder 63 is mounted on the plate 65 for lateral shift by means of the stem 70 extending from the holder 63 which is received within an opening 71 formed on the plate 65. A spring 72 acts between the holder 63 and the plate surface 73 to urge the holder toward the right as viewed in FIG. 8 with the movement being limited by a C-washer 74. The holder 63 is rotatable in 180° increments and is held in either of these positions by a pair of spring detents 75 and 76 which engage in opposed grooves 77 and 78 on the surface of stem 70. The holder 63 mounts an elongate member 79 having a groove 80 to receive the board 10 and this member is fitted in a recess in the holder 63 and secured thereto by a pin 81. A pair of spring fingers 82 and 83 on the member 79 engage the upper side of a board 10 and function to hold yieldably a board in the groove 80.

Figure 7:
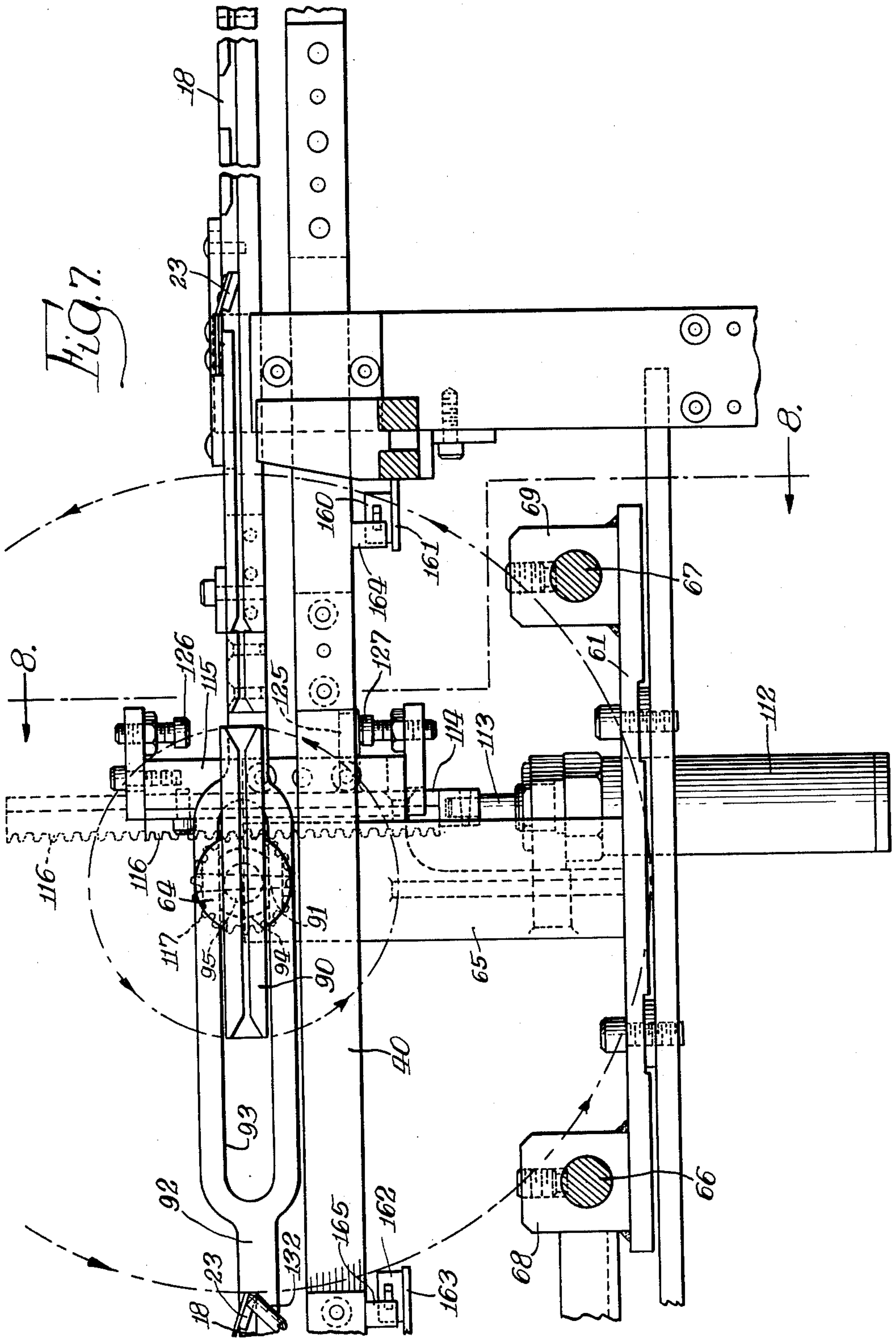
FIG. 7 is a vertical section on an enlarged section taken generally along the line 7—7 in FIG. 3.

The opposite holder 64 also has a grooved insert 90 which is pinned thereto by a pin 91. The holder 64 is secured to the movable rail 18 for reciprocable movement therewith. This is accomplished by a connecting member 92 extending between the two sections of movable rail 18 as shown in FIG. 7. This member 92 has an elongate slot 93 intermediate the ends thereof which has a sleeve member 94 secured thereto. The holder 64 has a stem 95 (FIG. 9) movably mounted and extending through the sleeve 94 with a block 96 secured on it by screws 97. The block 96 carries a pair of springs 98 and 99 engaging a pair of pins 100 and 101 respectively which engage against the sleeve 94. The block 96 is movable on the pins 100 and 101 and the springs act to urge the holder 64 to the right as viewed in FIG. 9 to a position ready to receive or discharge a board.

The block 96 traveling with the movable rail 18 is removably engaged with a power unit for obtaining shift of a board and subsequent rotation thereof. This power unit embodies a sleeve 105 secured to the upstanding member 62 of the frame which has a second rotatable sleeve 106 mounted therein and a slidable rod 107 inside the sleeve 106. The rod 107 is connected as indicated at 108 to the piston 109 of a double acting motor cylinder 110 so that when the cylinder is actuated the rod 107 is moved to the left as viewed in FIG. 9 to engage the block 96 and shift the holders 63 and 64 toward the left. Movement of the holder 64 to the holder 63 is transmitted through a board positioned between the holders. This transfers the board laterally to a position in which it will be out of alignment with the guide rail 18 for free rotation through an arc of 180°. This makes it possible to handle boards of varying lengths. The cylinder 110 is actuated in the other direction to cause return of the rod 107 and springs 98 and 99 cause return of holder 64. The spring 72 causes return of the holder 63. The motor 110 is mounted on the frame by a bracket structure indicated generally at 111.

Figures 8, 9:
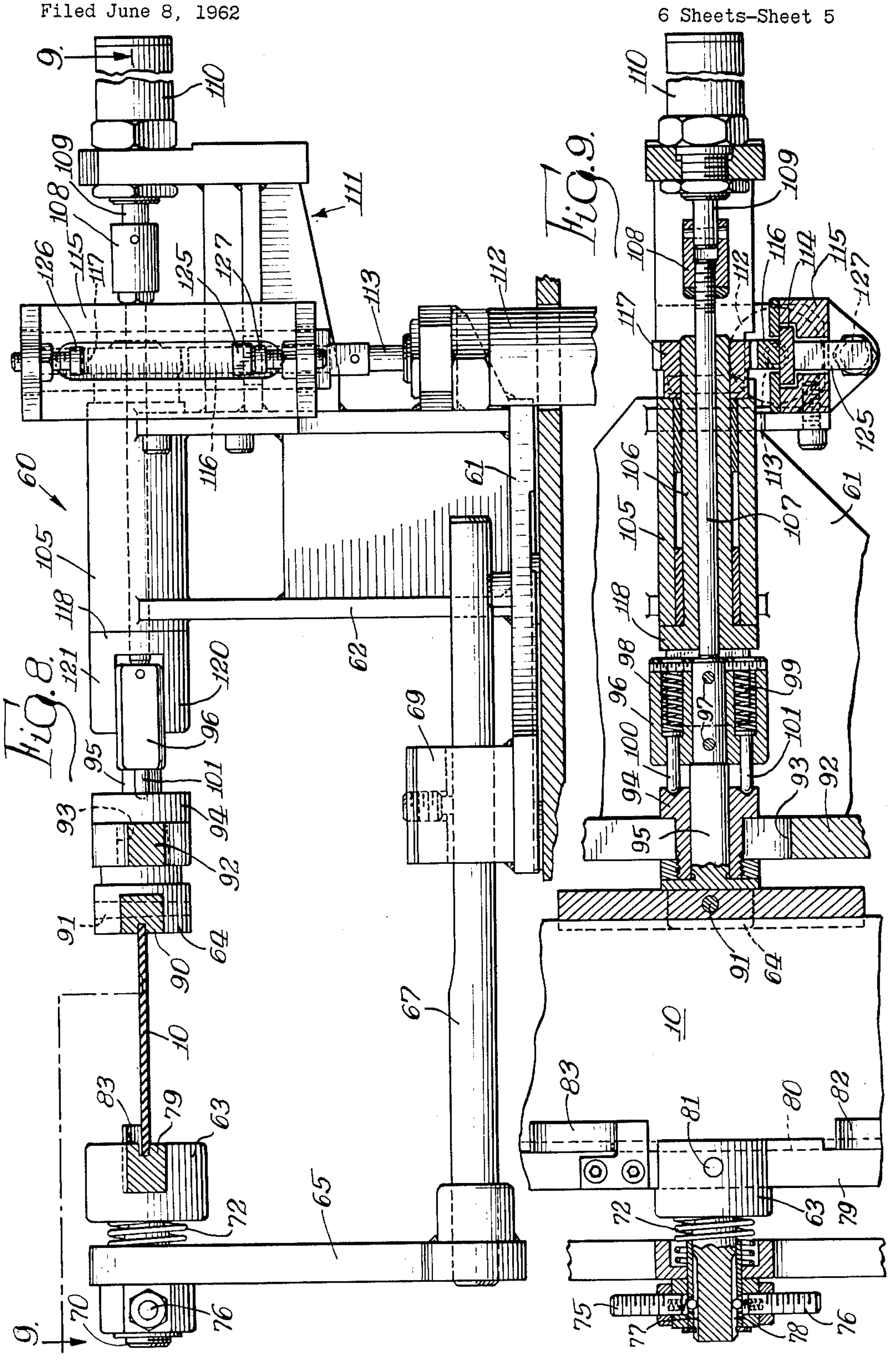
FIG. 8 is a vertical section taken generally along the line 8—8 in FIG. 7.
FIG. 9 is a plan section taken along the line 9—9 in FIG. 8.

After the board has been shifted to the left as viewed in FIG. 9, a double acting motor cylinder 112 is energized to cause rotation thereof through 180°. The motor has its rod 113 connected to a plate 114 guided on a bracket 115. The plate 114 carries a rack 116 engaging with a pinion 117 secured to the sleeve 106 which is mounted within the sleeve 105. The sleeve 106 is integral with a forked member 118 and the legs 120 and 121 of the forked member engage above and below the block 96, when in advanced position, which is connected to the holder 64.

The plate 114 carries an arm 125 projecting outside the bracket 115 and this arm travels between a pair of adjustable stops 126 and 127 (FIG. 7) which determine the limits of movement of the rack 116 to obtain the accurate 180° rotation of the turnover members 63 and 64. An air valve for the cylinder 112 is suitably connected in circuit to have the cylinder 112 operate in an opposite direction in the next turnover cycle.

Figures 4, 5, 6:
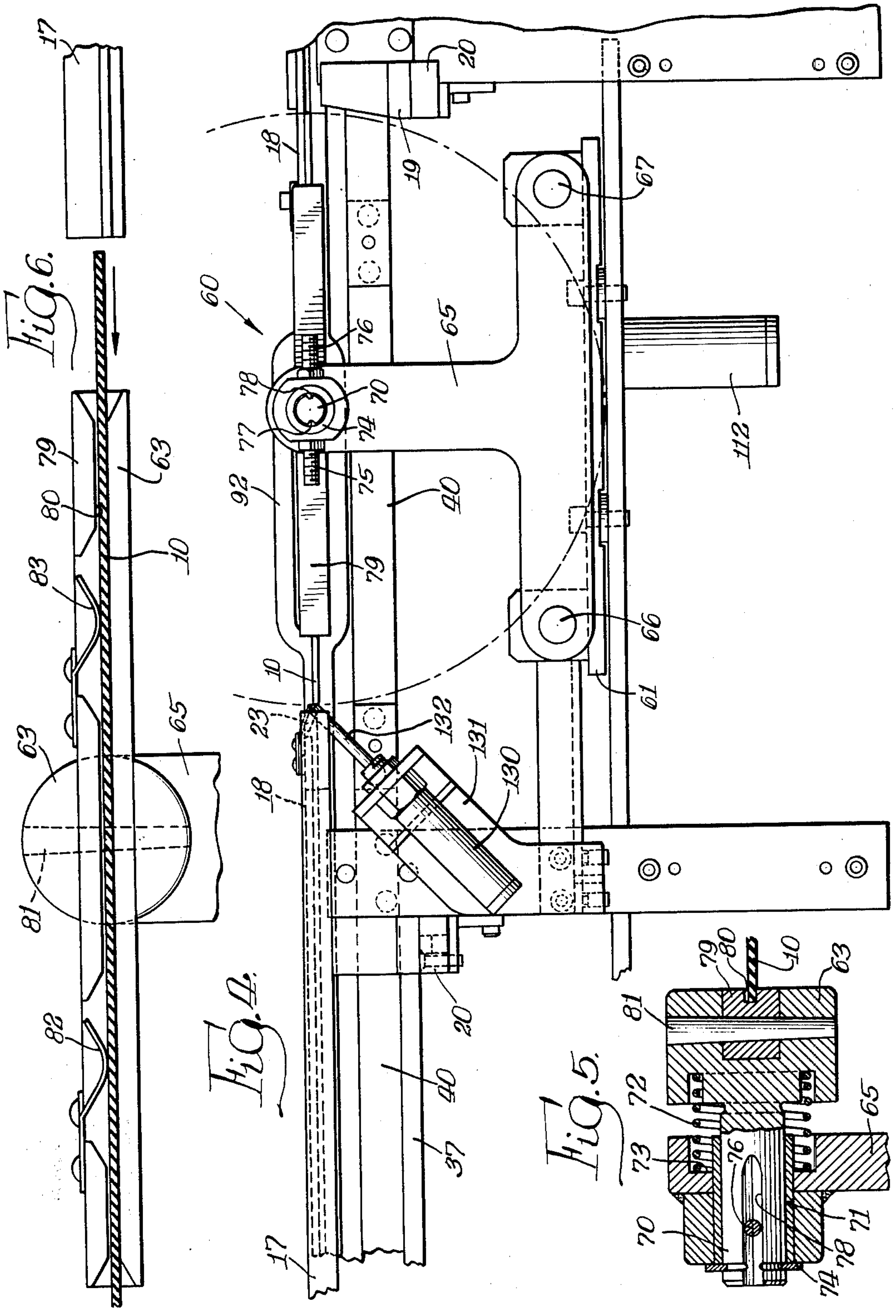
FIG. 4 is a front elevational view of the turnover mechanism taken along the line 4—4 in FIG. 3.
FIG. 5 is a fragmentary vertical section taken generally along the line 5—5 in FIG. 3.
FIG. 6 is a vertical section on an enlarged scale taken generally along the line 6—6 in FIG. 3.

A pneumatic cylinder 130 (FIG. 4) is supported from the frame by bracket 131 at the turnover station and has a rod 132 which can be extended to a position to engage behind a board that has been inverted to hold the board stationary while the movable rail 18 is retracted to the left as viewed in FIG. 4.

There are four switches controlling the operation of the turnover device including a switch 160 (FIG. 7) supported on the frame by a bracket 161 and a switch 162 (FIG. 7) supported on the frame by a bracket 163. These two switches are operated by lugs 164 and 165, respectively, carried on the dowel actuating rod 40. Two additional switches are mounted on the frame of the machine and are identified at 170 and 171 in FIG. 1. These switches are alternately operated by an arm 172 connected to the head operating rod 51.

In a cycle of operation, the transfer rail 18 is operated to advance a board and the holder 64 from a station to the turnover station. Under the control of the machine, the transfer rail 18 then stops and the dowel pin actuating rod 40 is shifted to the right, as viewed in FIG. 1 to raise the dowel pins 35 and 36 and at the same time the lug 164 operates the switch 160 which controls a valve (not shown) to supply air to the cylinder 110 which shifts the holders 63 and 64 to the left, as viewed in FIG. 8. This results in moving a board 10 out of the groove of the guide rail 18. The next step in the cycle is to actuate the rod 51 to operate the heads at the stations and move them downwardly and at the same time the arm 172 engages the switch 170 which operates a valve (not shown) to supply air to the cylinder 112 and cause the turnover unit to rotate the board 180°. The rod 51 then returns to initial position, which causes operation of switch 171 (FIG. 1) as the heads at the stations rise. The switch 171 operates a valve (not shown) to supply air to the cylinder 130 for raising rod 132 to a position to engage behind a board in the turnover device. This also reverses the supply of air to the motor cylinder 110 to permit retraction of the holding members 63 and 64 of the turnover. The transfer rail 18 is then moved to the left as viewed in FIG. 1 by operation of its cylinder 21 and the dowel actuating rod 40 is then operated to lower the dowel pins 35 and 36 at the stations. As this rod 40 returns, the lug 165 engages the switch 162 to operate a valve to supply air to the other end of the cylinder 130 to lower the rod 132 so that a succeeding board can move into the turnover station.

I claim:

1. An apparatus for inserting circuit elements in a circuit board having receiving holes comprising, in combination, a series of inserting stations, rail means extending through and between said stations for receiving an edge of a board to support the board for movement and present one side of the board at a station, means extending through and between said stations for advancing a board step-by-step to successive stations, means intermediate two of said stations for inverting a board to present an opposite side of the board to heads at succeeding stations including a member rotatably mounted on said board advancing means for holding a board, means for releasably receiving said member upon movement of said board advancing means, and means to rotate said receiving means to invert said member and a board carried thereby, and means to hold an inverted board stationary while said member and board advancing means are retracted.

2. A turnover device for circuit boards comprising, first and second board holders with opposed board receiving grooves and spaced apart to receive a board therebetween, means mounting said first holder for yielding movement and rotation, means mounting said second holder for movement toward said first holder, means for moving said second holder toward said first holder and with a board therebetween said first holder also being caused to move to place a board in a position for turnover, and means for rotating said second holder with resultant movement of the first holder due to the interconnection by a board to invert a board for subsequent operations.

3. In an apparatus for inserting members in a circuit board first on one side thereof and then on the other side including a line of inserting stations, board supporting rail means extending through said stations, means for conveying boards step-by-step along said rail means for location at successive stations, means located at a turnover station intermediately of said line of stations for inverting a board to present an opposite side at succeeding stations including a power unit located at said turnover station having a rotatable and shiftable member, a first motor operatively connected to said member to shift said member in either of opposite directions, a motor driven rack for rotating said member, a board holder attached to said conveying means and rotatably mounted thereon whereby said holder may advance into engagement with said member to be shifted laterally by said first motor and then inverted by said rack, and means at said turnover station movable to a position to engage behind a board and hold the board against retrograde movement.

4. An apparatus for inserting circuit elements in a circuit board having receiving holes comprising, in combination, frame means, a series of inserting stations on said frame means each for inserting an element into board holes, rail means on said frame means extending through and between said stations for receiving an edge of a board to support the board for movement and present one side of the board upwardly at a station, means extending through and between said stations for advancing a board step-by-step to successive stations, and means intermediate two of said stations for inverting a board to present the opposite side of the board upwardly at succeeding stations including a rotatable device with a board receiving member aligned with said rail means, and means for rotating said member.

5. In an apparatus for inserting members in a circuit board first on one side thereof and then on the other side including a line of inserting stations, frame means supporting said line of stations, board supporting rail means supported by said frame means and extending through said stations, means for conveying boards step-by-step along said rail means for location at successive stations, and means located intermediately of said line of stations for inverting a board to present an opposite side at succeeding stations.

6. In an apparatus for inserting members in a circuit board first on one side thereof and then on the other side including a line of inserting stations, means mounting said stations in line relation, means supported by said mounting means for conveying boards step-by-step for location at successive stations, and means located intermediately of said line of stations for offsetting a board from the conveying means and inverting the board and returning the board to the conveying means to present an opposite side at succeeding stations.

7. An apparatus for inserting circuit elements in a circuit board having receiving holes comprising, in combination, frame means, a series of inserting stations for placing elements into the board holes, rail means supported by said frame means and extending through and between said stations for receiving an edge of a board to support the board for movement and present one side of the board to a station, means extending through and between said stations for advancing a board step-by-step to successive stations, and means intermediate two of said stations for inverting a board to present an opposite side of the board to succeeding stations including a rotatable device with a board receiving member aligned with said rail means, means for shifting said member out of alignment with said rail means, and means for rotating said member.

References Cited in the file of this patent

UNITED STATES PATENTS

| | | |
|---|---|---|
| 2,021,893 | Mitchell | Nov. 26, 1935 |
| 2,208,251 | Evans | July 16, 1940 |
| 2,227,688 | Wood | Jan. 7, 1941 |
| 2,772,416 | Dorosz et al. | Dec. 4, 1956 |
| 2,906,010 | Hannable | Sept. 29, 1959 |
| 2,970,370 | Weaver et al. | Feb. 7, 1961 |